(12) United States Patent
Soh

(10) Patent No.: US 10,680,361 B2
(45) Date of Patent: Jun. 9, 2020

(54) CARD EDGE CONNECTOR

(71) Applicant: Molex, LLC, Lisle, IL (US)

(72) Inventor: Eng Kan Soh, Singapore (SG)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 16/220,218

(22) Filed: Dec. 14, 2018

(65) Prior Publication Data

US 2019/0199023 A1 Jun. 27, 2019

(30) Foreign Application Priority Data

Dec. 15, 2017 (CN) .......................... 2017 1 1350138

(51) Int. Cl.
| | |
|---|---|
| *H01R 12/00* | (2006.01) |
| *H01R 12/70* | (2011.01) |
| *H05K 7/14* | (2006.01) |
| *H01R 13/627* | (2006.01) |
| *H01R 12/72* | (2011.01) |
| *H01R 12/71* | (2011.01) |
| *H01R 12/73* | (2011.01) |

(52) U.S. Cl.
CPC ..... *H01R 12/7011* (2013.01); *H01R 12/7064* (2013.01); *H05K 7/1417* (2013.01); *H01R 12/716* (2013.01); *H01R 12/721* (2013.01); *H01R 12/737* (2013.01); *H01R 13/6273* (2013.01)

(58) Field of Classification Search
CPC ............ H01R 12/7011; H01R 12/7064; H01R 12/716; H01R 12/721; H01R 12/737; H01R 13/6273; H05K 7/1417

USPC ......................................................... 439/79

See application file for complete search history.

(56) References Cited

U.S. PATENT DOCUMENTS

| | | | |
|---|---|---|---|
| 4,142,810 A | 3/1979 | Lesaint | |
| 4,907,987 A * | 3/1990 | Douty ................ | H01R 12/7064 439/555 |

(Continued)

FOREIGN PATENT DOCUMENTS

| | | |
|---|---|---|
| CN | 2579010 Y | 10/2003 |
| CN | 204966747 U | 1/2016 |
| TW | M537320 U | 2/2017 |

*Primary Examiner* — Abdullah A Riyami
*Assistant Examiner* — Vladimir Imas
(74) *Attorney, Agent, or Firm* — Molex, LLC

(57) ABSTRACT

The present disclosure provides an electrical connector. The electrical connector comprises an insulative housing, a plurality of conductive terminals and a board fastener. The insulative housing has a mounting surface and a mating surface on opposite sides in a mating direction and a mounting chamber. The mounting chamber has a top accommodating portion and a bottom accommodating portion extending and penetrating the mounting surface from the top accommodating portion in the mating direction, two side walls defining the mounting chamber each are formed with a top limiting surface and a bottom limiting surface which define the top accommodating portion. The fastener has a mounting section accommodated in the top accommodating portion, an intermediate section extending from the mounting section and accommodated in the bottom accommodating portion and a tail section extending out of the mounting surface of the insulative housing from the intermediate section.

8 Claims, 17 Drawing Sheets

(56) References Cited

U.S. PATENT DOCUMENTS

| | | | | |
|---|---|---|---|---|
| 5,120,257 | A | 6/1992 | Hahn | |
| 5,154,634 | A * | 10/1992 | Brown | H01R 13/73 439/553 |
| 5,184,963 | A * | 2/1993 | Ishikawa | H01R 13/506 439/554 |
| 5,192,228 | A * | 3/1993 | Collins | H01R 13/658 439/567 |
| 5,244,414 | A * | 9/1993 | Peloza | H01R 12/7029 439/567 |
| 5,269,694 | A | 12/1993 | Kachlic et al. | |
| 5,387,115 | A * | 2/1995 | Kozel | H01R 12/712 439/157 |
| 5,393,247 | A * | 2/1995 | DiOrazio | H01R 12/7064 411/510 |
| 5,632,649 | A | 5/1997 | Spangler | |
| 5,957,722 | A * | 9/1999 | Pan | H01R 12/7029 439/567 |
| 5,971,803 | A * | 10/1999 | McHugh | H01R 12/7029 439/567 |
| 5,975,947 | A | 11/1999 | Wu et al. | |
| 6,250,938 | B1 * | 6/2001 | Tung | H01R 12/7064 439/152 |
| 6,948,957 | B1 * | 9/2005 | Costello | H01R 12/7058 439/157 |
| 7,699,644 | B2 * | 4/2010 | Szczesny | H01R 12/721 439/377 |
| 7,927,114 | B2 * | 4/2011 | Li | H01R 12/721 439/108 |
| 7,972,171 | B2 * | 7/2011 | Teh | H01R 12/7064 439/329 |
| 7,988,480 | B2 | 8/2011 | Yao et al. | |
| 8,157,576 | B2 * | 4/2012 | Fu | H01R 12/721 439/153 |
| 8,388,362 | B2 * | 3/2013 | Su | H01R 12/7029 439/153 |
| 8,444,424 | B2 * | 5/2013 | Shen | H01R 13/62988 439/153 |
| 9,240,640 | B2 * | 1/2016 | Shen | H01R 12/7029 |
| 9,876,314 | B1 * | 1/2018 | Cai | H01R 12/721 |

* cited by examiner

CARD EDGE CONNECTOR

RELATED APPLICATIONS

This application claims priority to Chinese Application No. 201711350138.4, filed Dec. 15, 2017, which is incorporated herein by reference in its entirety.

FIELD AND BACKGROUND OF THE PRESENT DISCLOSURE

The present disclosure relates to an electrical connector, especially to an electrical connector having a board fastener to be fixed to a circuit board. Some existing electrical connectors need to be fixed with a circuit board through a locking clip fixed to an insulative housing. For example, U.S. Pat. No. 5,269,694 discloses an electrical connector that is fixed to a circuit board using a locking clip. The locking clip is substantially formed by stamping a metal plate and has two locking tabs formed by tearing and bending toward one plate surface of plate surfaces of a plate body and protruding from the one plate surface, and is fixed to an insulative housing through the locking tabs. However, such a structure of the locking tab is easily cracked at the position where the locking tab is torn to reduce the strength of the entire locking clip, and the locking tab is short and hard, and is easy to wipe a hole wall surface of the insulative housing to cause harmful interference during assembling, which cause that it not easy to assemble.

Further, for example, Chinese patent application No. CN951211242 (corresponding to U.S. Pat. No. 5,632,649) discloses a hold-down device for fixing an electrical connector assembly to a circuit board, the hold-down device is received in a cavity of an insulative housing, and wall surfaces defining the cavity are formed with two shoulders protruding toward each other, and the shoulder has an upper surface and a lower surface on opposite sides. The hold-down device has two stops respectively extending outwardly toward both sides, a tip that can abut against the upper surface of the shoulder is formed at the end of the stop, and the hold-down device has two retention wings upwardly and obliquely outwardly extending, top edges of the retention wings can respectively abut against the lower surfaces of the shoulders. When the hold-down device is mounted, the two retention wings are squeezed during passing the shoulders and elastically displaced toward each other, and then elastically recovers after passing the shoulders to make the top edges abut against the lower surfaces of the shoulders. The hold-down device needs to be configured such that a distance between the tip of the stop and the top edge of the retention wing is slightly less than a distance between the upper surface and the lower surface of the shoulder, so that the stop and the retention wing can reliably clamp and fix the shoulder. However, such a configuration must more accurately control the distance between the tip of the stop and the top edge of the retention wing, and an insertion force must be accurately controlled, otherwise, the retention wing of the hold-down device cannot be elastically displaced toward the lower surface of the shoulder, which may result in that the retention wing of the hold-down device is seized and fails to be assembled. Moreover, the stop and the retention wing are arranged in an up-down direction and have a certain distance therebetween, so that the entire hold-down device is overlong, and is not applicable to some space-limited or compact electrical connectors.

SUMMARY OF THE PRESENT DISCLOSURE

Accordingly, one of the objects of the present disclosure is to provide an electrical connector having a board fastener which can shorten a dimension thereof and has better strength and retention force.

Accordingly, in some embodiments, an electrical connector of the present disclosure comprises an insulative housing, a plurality of conductive terminals provided to the insulative housing and at least one board fastener. The insulative housing has a mounting surface and a mating surface on opposite sides in a mating direction and at least one mounting chamber, the mounting chamber extends and penetrates the mounting surface in the mating direction, and the mounting chamber has a top accommodating portion and a bottom accommodating portion extending and penetrating the mounting surface from the top accommodating portion in the mating direction, the insulative housing further has two side walls facing each other in a width direction perpendicular to the mating direction, and each corresponding side wall is formed with a top limiting surface and a bottom limiting surface which define the top accommodating portion, the top limiting surface faces the mounting surface, the bottom limiting surface faces the top limiting surface in the mating direction and is closer to the bottom accommodating portion than the top limiting surface. The at least one board fastener is provided to the insulative housing and corresponds to the at least one mounting chamber. The board fastener is plate-shaped and has a mounting section accommodated in the top accommodating portion, an intermediate section extending from the mounting section and accommodated in the bottom accommodating portion and a tail section extending out of the mounting surface of the insulative housing from the intermediate section. The mounting section has a body portion connecting the intermediate section, two abutting shoulders respectively abutting against the two bottom limiting surfaces and two latching elastic arms extending from both sides of the body portion and having ends thereof respectively to abut against the two top limiting surfaces, so that the mounting section is limited in position by the two bottom limiting surfaces and the two top limiting surfaces in the mating direction.

In some embodiments, each latching elastic arm has a transverse portion connecting the body portion, and the transverse portions of the two latching elastic arms respectively form the two abutting shoulders on sides of the transverse portions of the two latching elastic arms toward the mounting surface.

In some embodiments, a width of the top accommodating portion in the width direction is greater than a width of the bottom accommodating portion, and the bottom limiting surfaces are formed at a boundary between the top accommodating portion and the bottom accommodating portion, and the two side walls each are provided with a limiting block forming the top limiting surface, a minimum distance between the two limiting blocks respectively on the two side walls is less than a maximum distance between the two latching elastic arms.

In some embodiments, each limiting block further forms a guiding surface opposite to the top limiting surface in the mating direction, the guiding surfaces of the two limiting blocks obliquely extend toward each other and obliquely to the mounting surface, the two side walls each form a guiding groove extending in the mating direction and adjacent to the corresponding guiding surface, so that the two latching elastic arms are guided through the guiding grooves and the guiding surfaces to enter the top accommodating portion when the board fastener is mounted.

In some embodiments, each latching elastic arm further has a straight extending portion bending from the transverse portion and extending toward a direction away from the mounting surface in the mating direction, and an oblique extending portion extending from the straight extending portion toward a direction away from the mounting surface and gradually away from the body portion.

In some embodiments, the board fastener further has a plurality of interference protruding-blocks protruding from both sides of the intermediate section in the width direction, so as to interfere with the bottom accommodating portion.

In some embodiments, the tail section extends in a plate shape as whole from the intermediate section to be adapted to be soldered.

In some embodiments, the tail section bifurcates from the intermediate section to be two insert legs.

In some embodiments, the insulative housing further has two recessed portions respectively extending from the two top limiting surfaces toward the mounting surface in the mating direction and penetrating the two side walls in the width direction.

The present disclosure at least has the following beneficial effects: the non-destructive limit abutment structure between the latching elastic arm integrally formed on both sides of the mounting section of the board fastener and the insulative housing enables the board fastener to be assembled more robustly and firmly on the insulative housing, particularly is capable of withstanding mechanical shock and vibration. Moreover, a limiting structure formed directly by the latching elastic arm which can be limited in position by the insulative housing in the mating direction enables the dimension of the board fastener to be effectively compact.

BRIEF DESCRIPTION OF THE FIGURES

The other features and effects of the present disclosure will be apparent through embodiments with reference to the Figures, in which.

Figure 1:
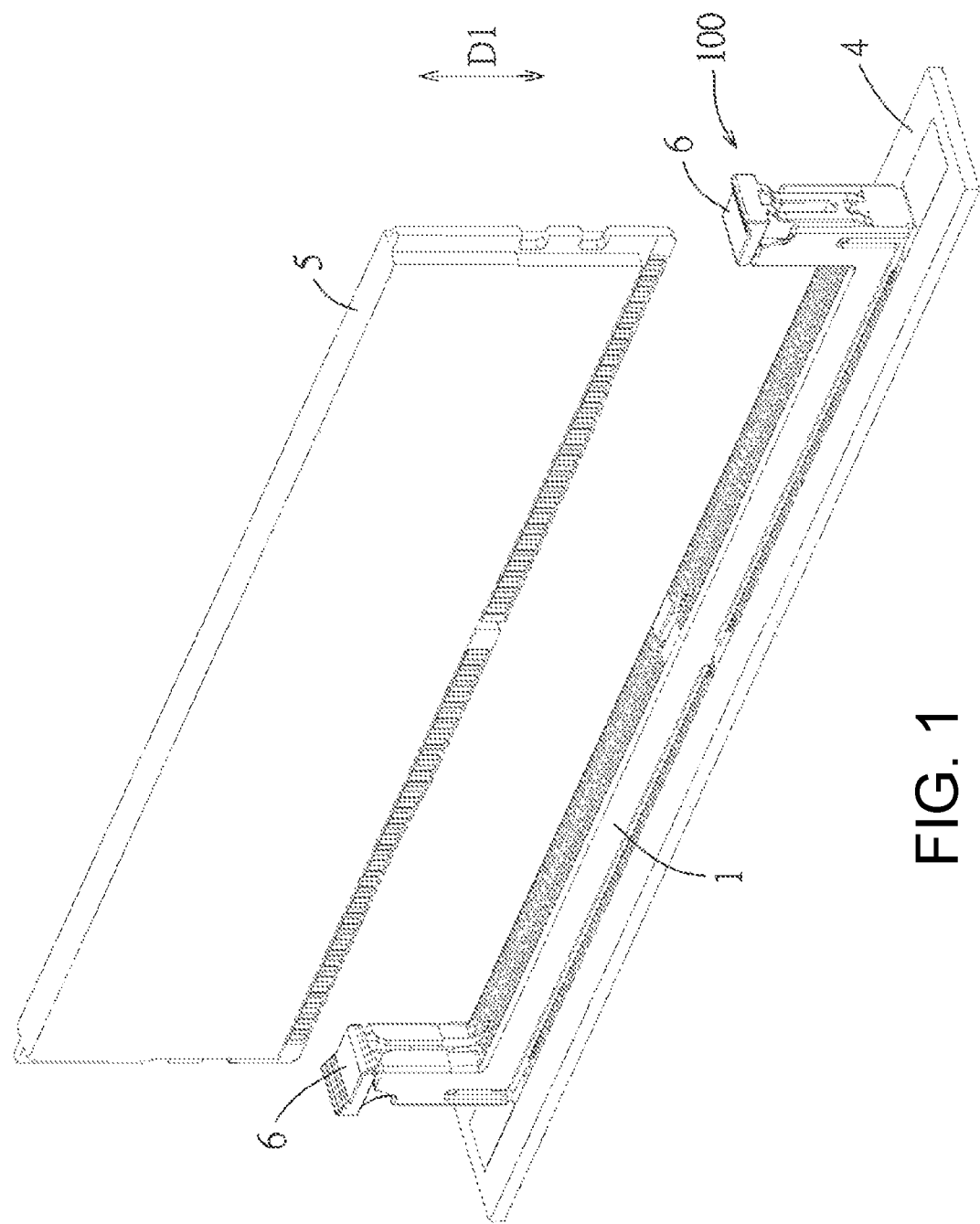
FIG. 1 is an exploded perspective view of a first embodiment of an electrical connector of the present disclosure, a circuit board and an electronic card.

Reference numerals are represented as follows:
100 electrical connector
1 insulative housing
11 mounting surface
12 mating surface
121 slot
13 mounting chamber
131 top accommodating portion
132 bottom accommodating portion
14 side wall
141 top limiting surface
142 bottom limiting surface
143 limiting block
144 guiding surface
145 guiding groove
15 surrounding wall
16 recessed portion
2 conductive terminal
3 board fastener
31 mounting section
311 body portion
312 abutting shoulder
313 latching elastic arm
313*a* transverse portion
313*b* straight extending portion
313*c* oblique extending portion
32 intermediate section
33 tail section
331 insert leg
34 interference protruding-block
4 circuit board
41 through hole
42 inserting hole
5 electronic card
6 latching member
D1 mating direction
D2 width direction

DETAILED DESCRIPTION

Before the present disclosure is described in detail, it should be noted that like elements are indicated by same reference numerals in the following description.

Figure 2:
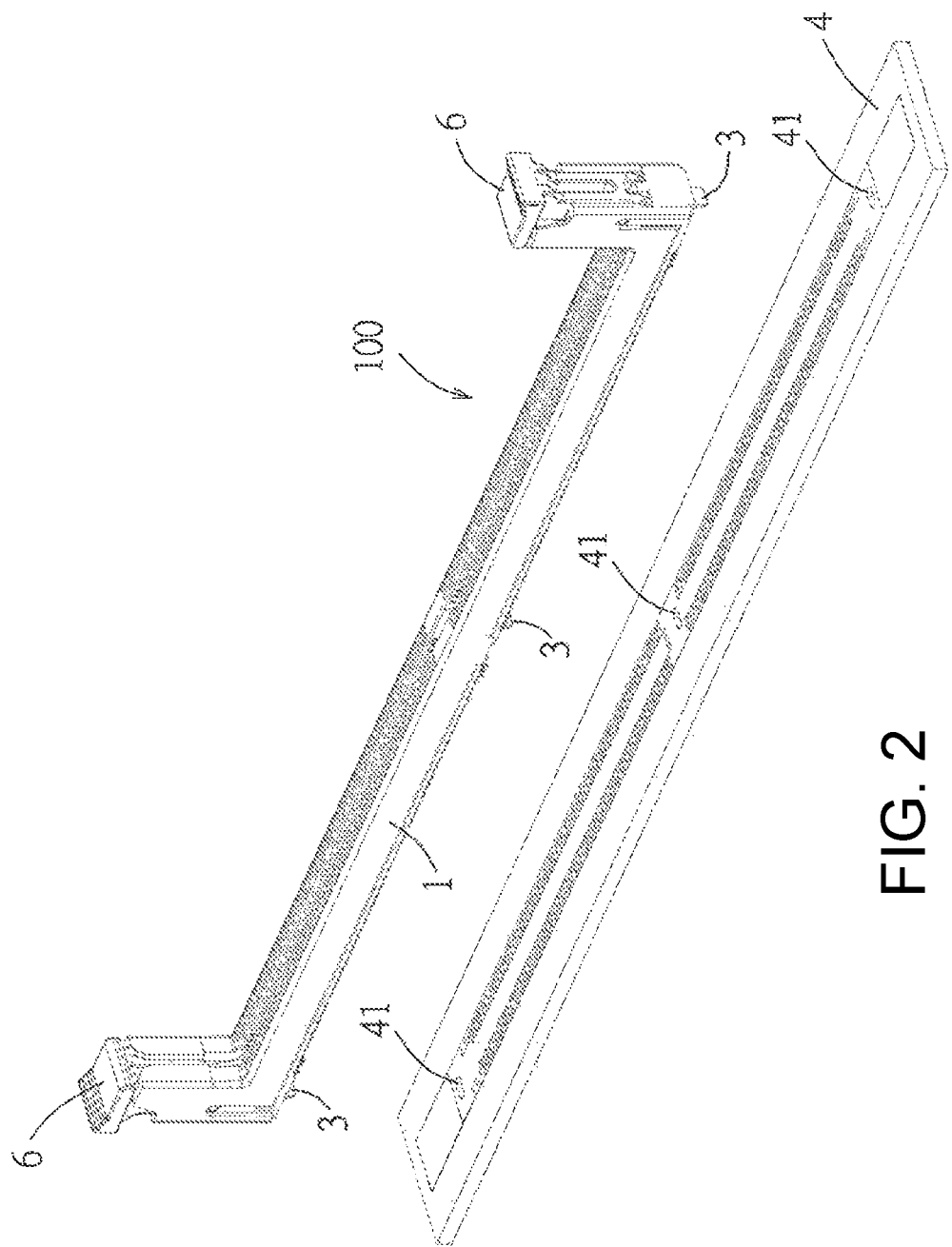
FIG. 2 is an exploded perspective view of the first embodiment and the circuit board.
Figure 3:
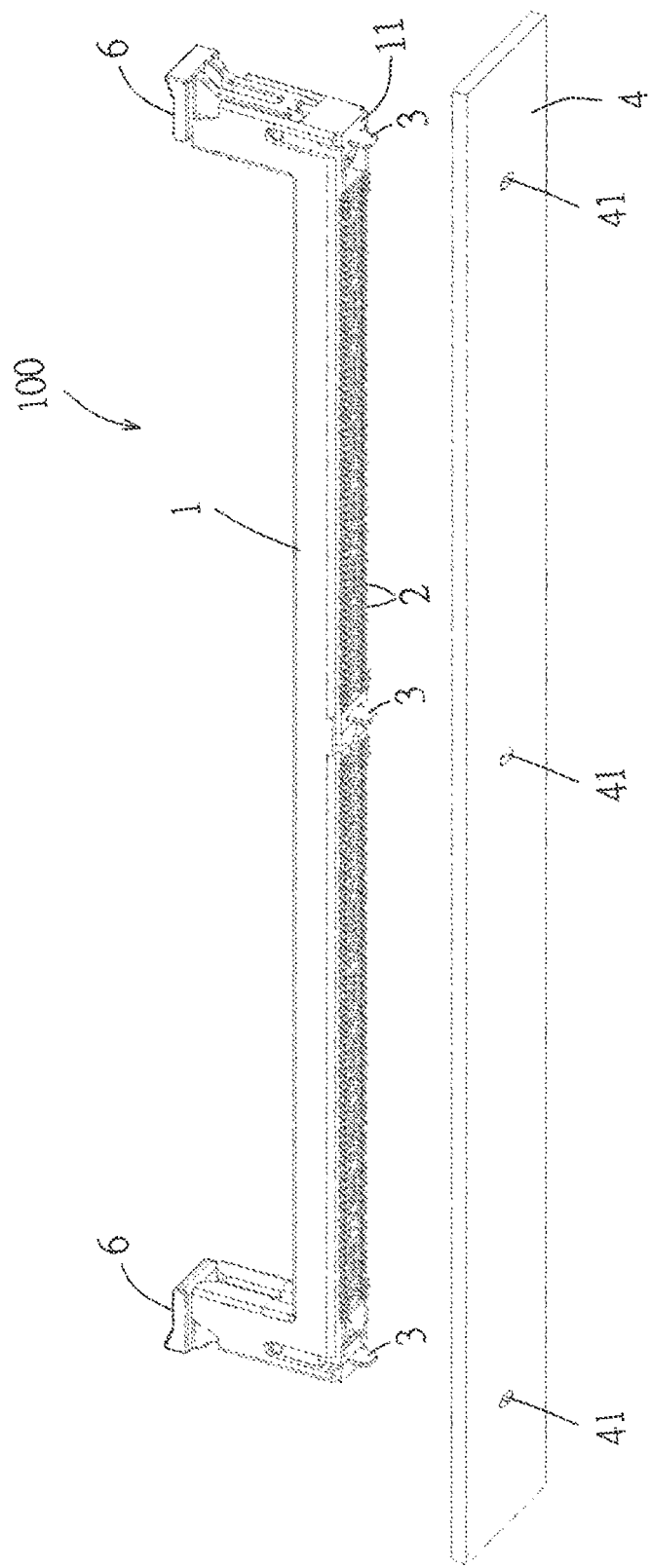
FIG. 3 is a view of FIG. 2 from another angle.

Referring to FIG. 1 to FIG. 3, a first embodiment of an electrical connector of the present disclosure is adapted to be mounted on a circuit board 4 to electrically connect an electronic card 5. The electrical connector 100 comprises an insulative housing 1, a plurality of conductive terminals 2 provided to the insulative housing 1 and a plurality of board fasteners 3 provided to the insulative housing 1. In the first embodiment, the electrical connector 100 is a card edge connector, and further comprises two latching members 6 respectively pivoted to both ends of the insulative housing 1 to latch with and fix the electronic card 5 when the electronic card 5 is mated with the electrical connector 100. The plurality of board fasteners 3 are used to be provided through the corresponding through hole 41 on the circuit board 4, so as to fix the electrical connector 100 to the circuit board 4. The number of the board fasteners 3 can be adjusted according to the dimension of the insulative housing 1, in the first embodiment, the plurality of board fasteners 3 are provided according to the elongated shape of the insulative housing 1, in the varied embodiment, if the dimension of the insulative housing 1 is relatively small, only one board fastener 3 can be provided.

Figure 4:
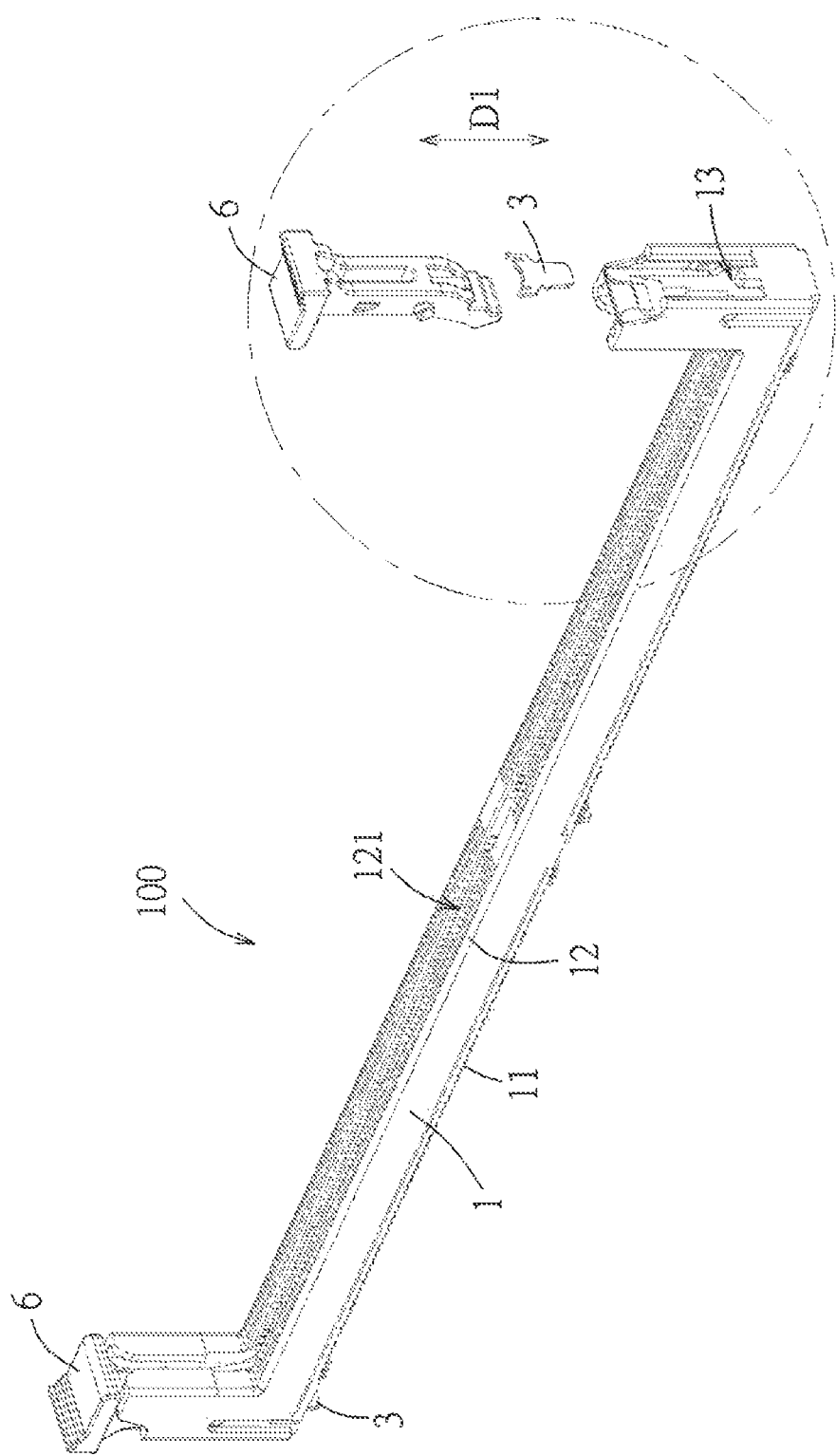
FIG. 4 is an exploded perspective view of the first embodiment.
Figure 5:
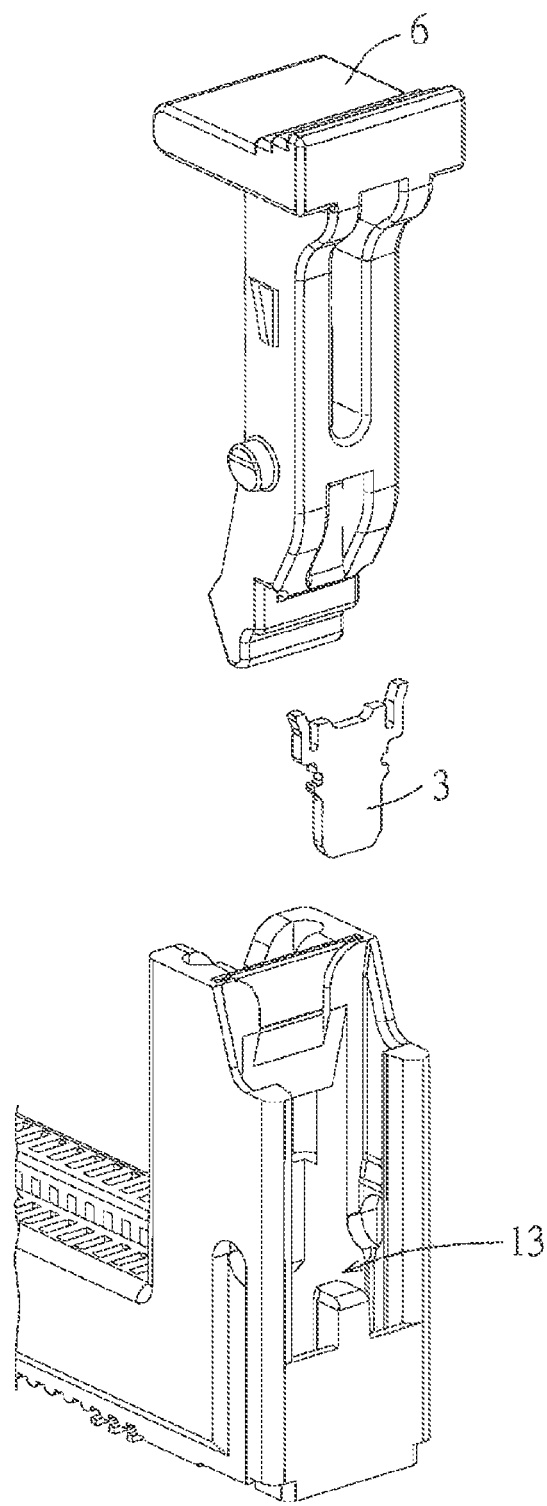
FIG. 5 is a partial enlarged view of FIG. 4.

Referring to FIG. 4 and FIG. 5, the insulative housing 1 has a mounting surface 11 and a mating surface 12 on opposite sides in a mating direction D1 and at least one mounting chamber 13. In the first embodiment, the mating direction D1 is a mating direction of the electronic card 5 (see FIG. 1) with the electrical connector 100, and the mating surface 12 is provided with a slot 121 into which the electronic card 5 is inserted. The insulative housing 1 has a plurality of mounting chambers 13 to respectively accommodate the plurality of board fasteners 3, for sake of convenience of explanation, the following description is only for a corresponding set of mounting chambers 13 and board fasteners 3.

Figure 6:
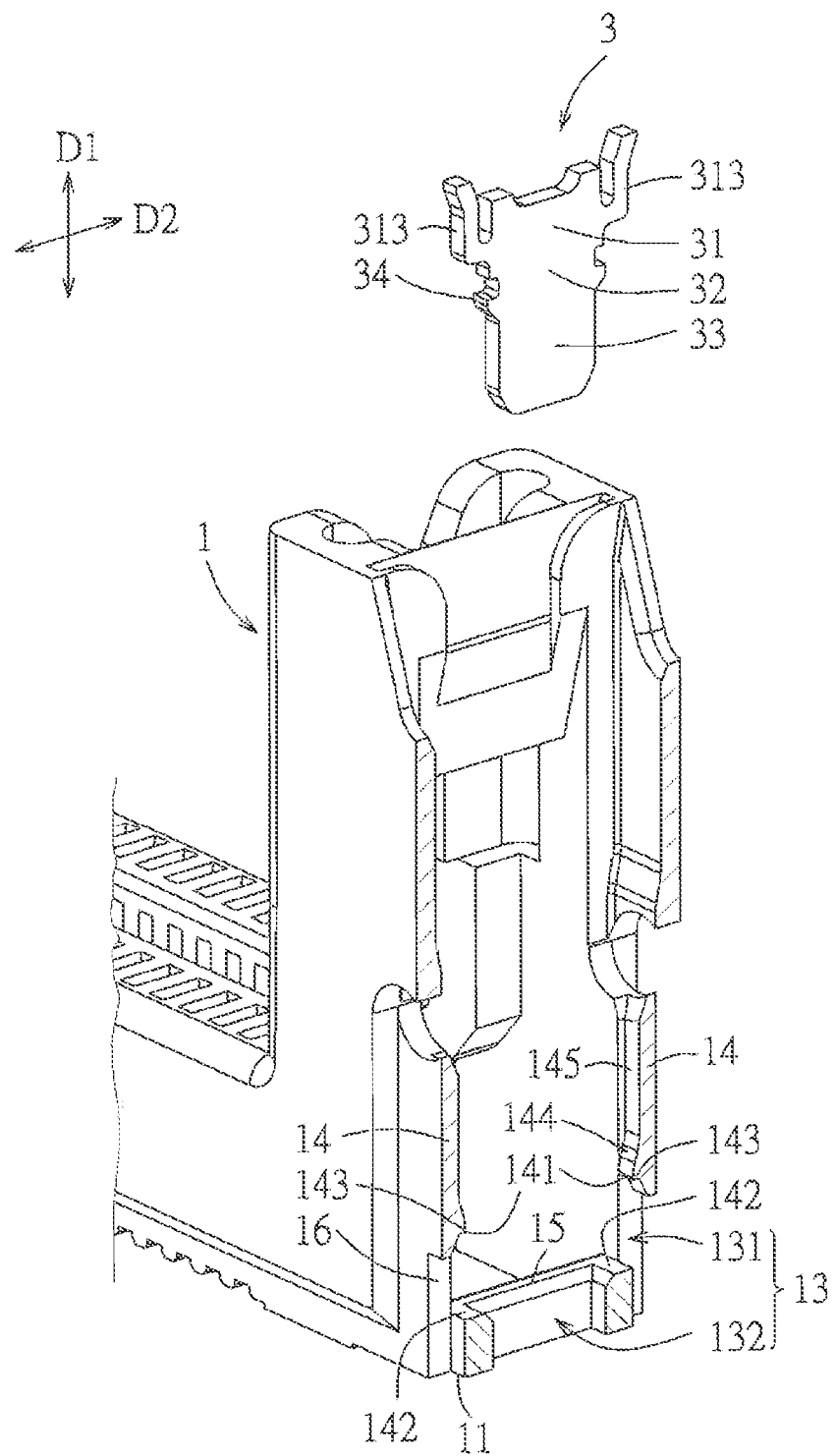
FIG. 6 is a partial exploded cross-sectional perspective view of the first embodiment, in which a latching member is not shown.
Figure 7:
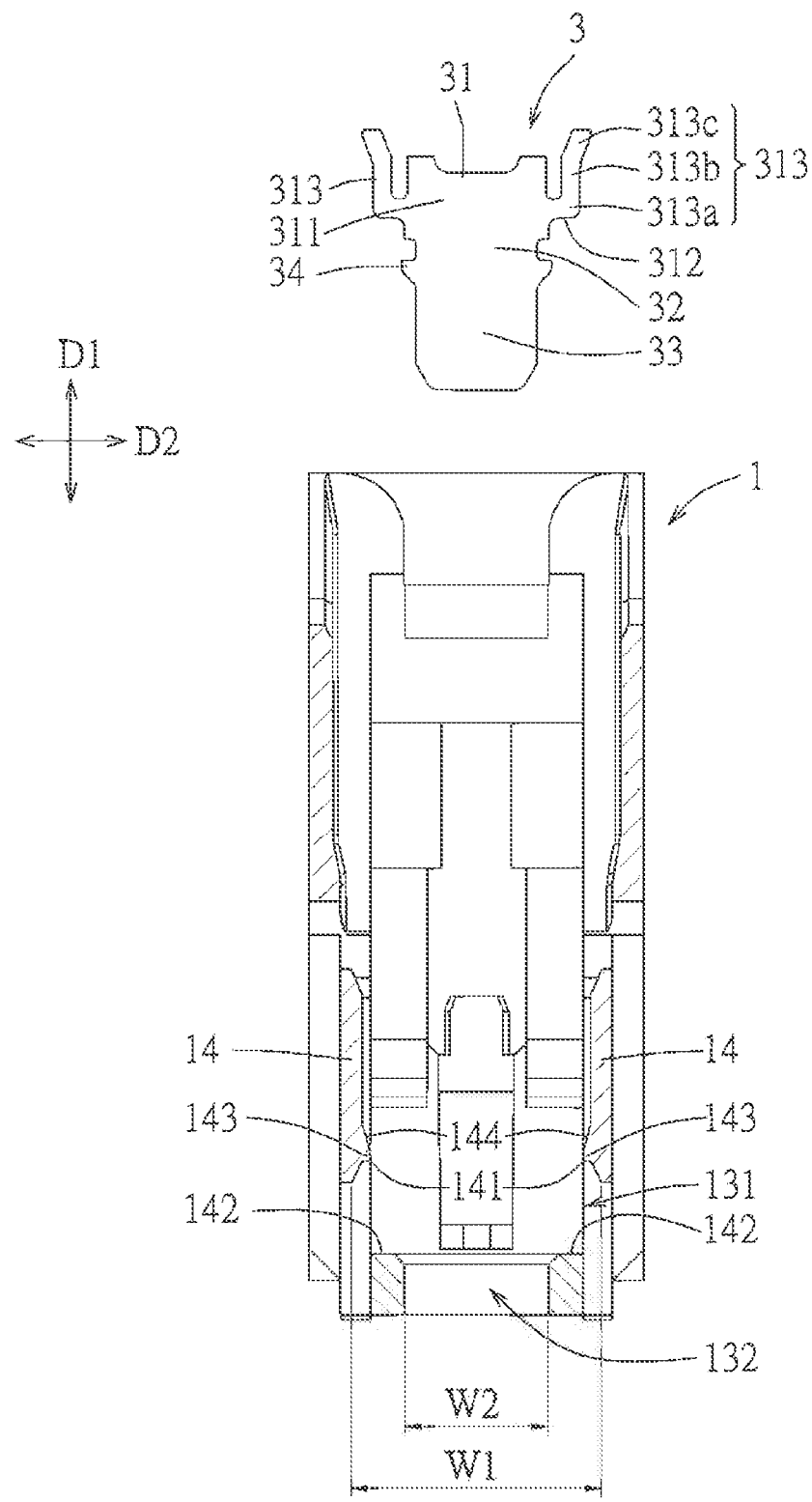
FIG. 7 is an exploded cross-sectional view corresponding to FIG. 6.
Figure 8:
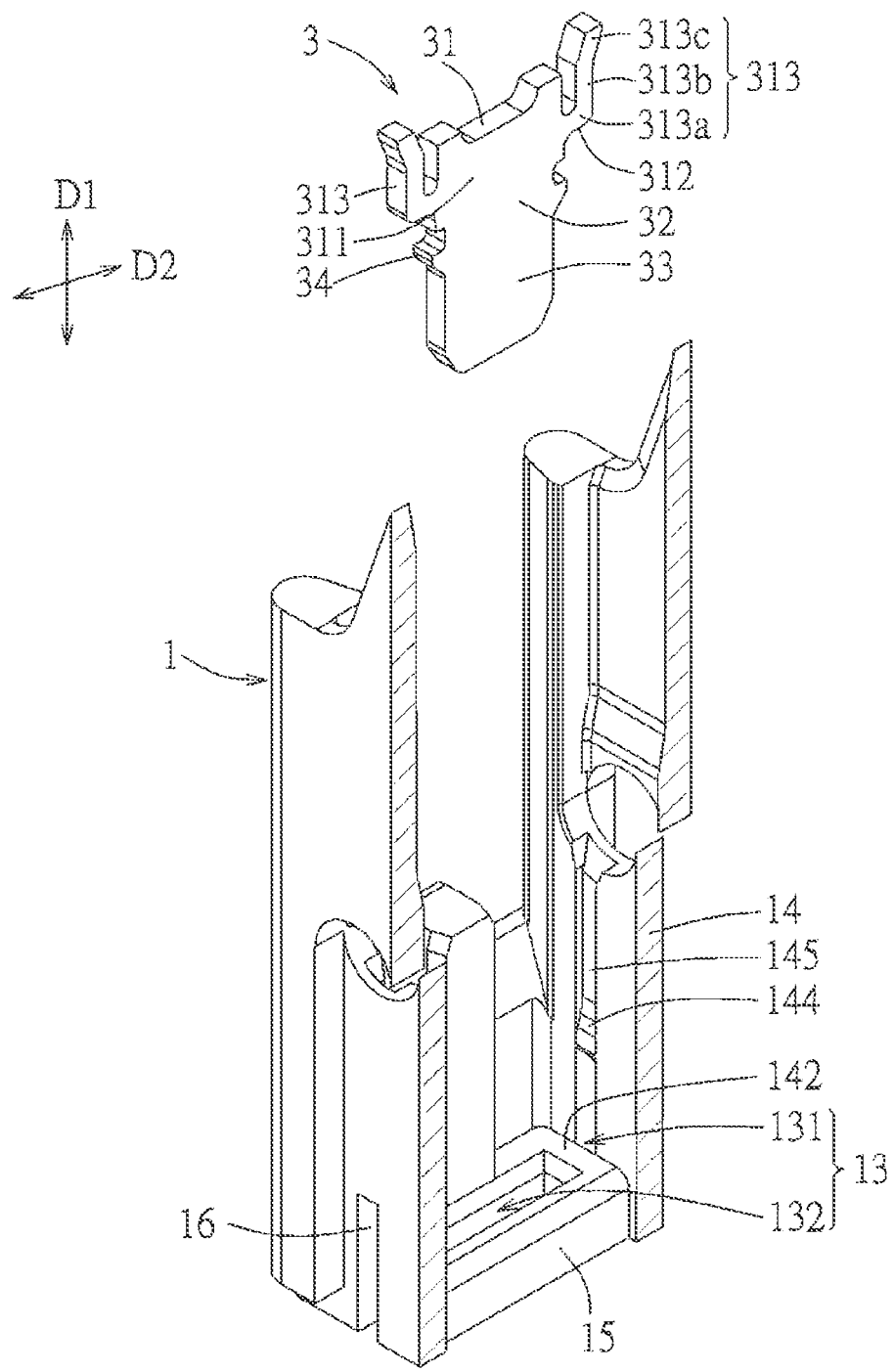
FIG. 8 is a partial exploded cross-sectional perspective view corresponding to an opposite direction of FIG. 6.
Figure 9:
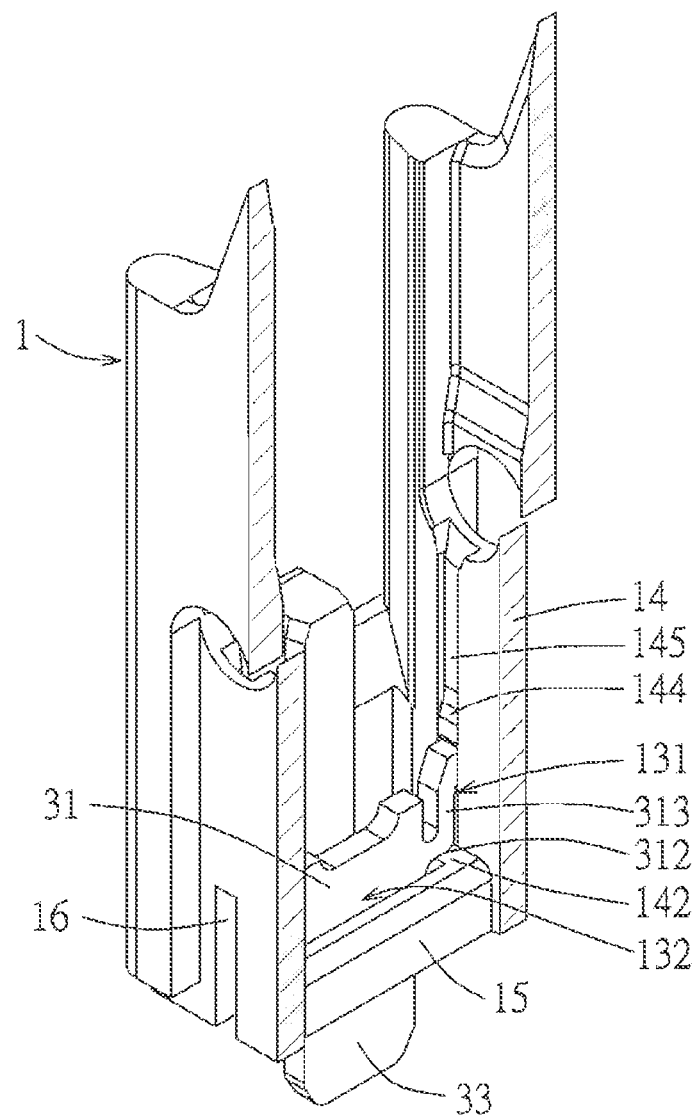
FIG. 9 is an assembled view similar to FIG. 8.
Figure 10:
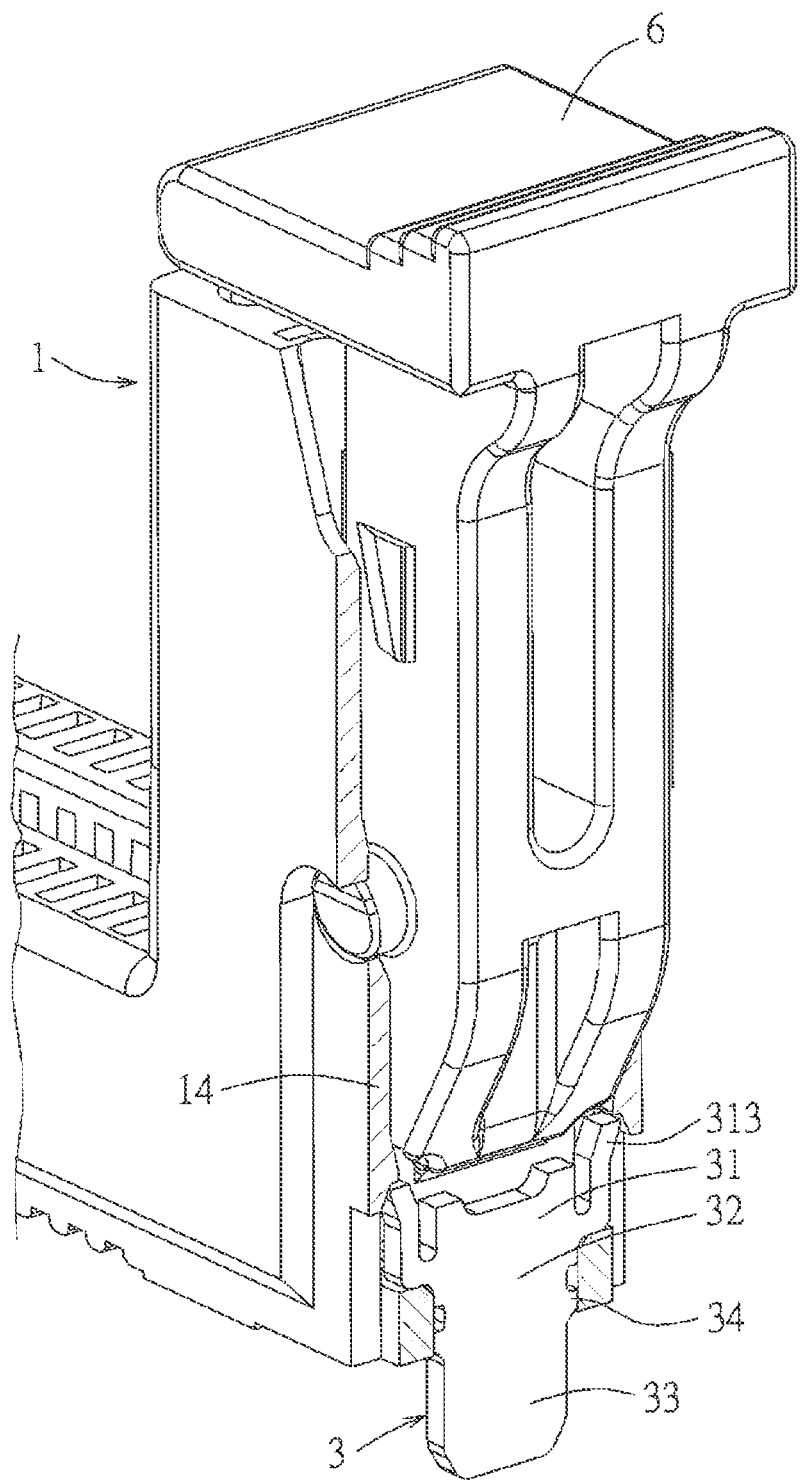
FIG. 10 is a partial cross-sectional perspective view of the first embodiment.

Referring to FIG. 6 to FIG. 8, the mounting chamber 13 extends and penetrates the mounting surface 11 in the mating direction D1, and has a top accommodating portion 131 and a bottom accommodating portion 132 extending from the top accommodating portion 131 in the mating direction D1 and penetrating the mounting surface 11. The insulative housing 1 further has two side walls 14 facing each other in a width direction D2 perpendicular to the mating direction D1, and each corresponding side wall 14 is formed with a top limiting surface 141 and a bottom limiting surface 142 which define the top accommodating portion 131, the top limiting surface 141 faces the mounting surface 11, the bottom limiting surface 142 faces the top limiting surface 141 in the mating direction D1 and is closer to the bottom accommodating portion 132 than the top limiting surface 141. In the first embodiment, a width W1 of the top accommodating portion 131 in the width direction D2 is greater than a width W2 of the bottom accommodating portion 132, thus the bottom limiting surfaces 142 are formed at a boundary between the top accommodating portion 131 and the bottom accommodating portion 132. Specifically, in the first embodiment, the insulative housing 1 has a surrounding wall 15 connecting the two side walls 14 along the width direction D2, the bottom accommodating portion 132 is a penetrating-groove shaped surrounding space which penetrates the mounting surface 11 and is formed by being surrounded by the surrounding wall 15, a top surface of the surrounding wall 15 forms the bottom limiting surface 142. And the two side walls 14 each are provided with a limiting block 143 forming the top limiting surface 141. Each limiting block 143 further form a guiding surface 144 opposite to the top limiting surface 141 in the mating direction D1, the guiding surfaces 144 of the two limiting blocks 143 obliquely extend toward each other and obliquely to the mounting surface 11. The two side walls 14 each form a guiding groove 145 extending in the mating direction D1 and adjacent to the corresponding guiding surface 144. The insulative housing 1 further has two recessed portions 16 respectively extending from the two top limiting surfaces 141 toward the mounting surface 11 in the mating direction D1 and penetrating the two side walls 14 in the width direction D2, the recessed portions 16 are communicated with the top accommodating portion 131.

Figure 11:
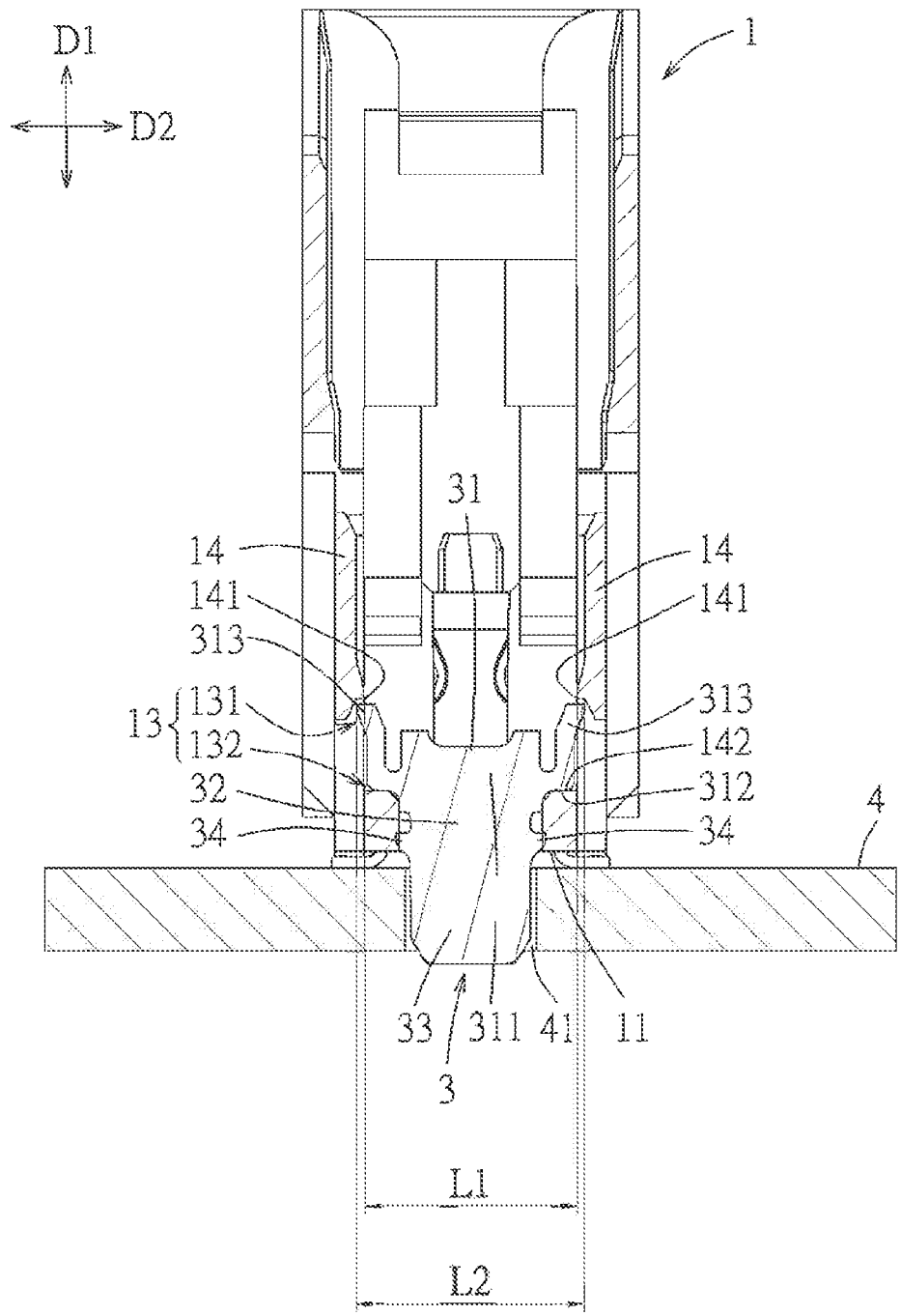
FIG. 11 is a cross-sectional perspective view of an assembled state of the first embodiment and the circuit board, in which the latching member is not shown.

Referring to FIG. 7 to FIG. 11, the board fastener 3 is plate-shaped and has a mounting section 31 accommodated in the top accommodating portion 131, an intermediate section 32 extending from the mounting section 31 and accommodated in the bottom accommodating portion 132, and a tail section 33 extending out of the mounting surface 11 of the insulative housing 1 from the intermediate section 32. The mounting section 31 has a body portion 311 connecting the intermediate section 32, two abutting shoulders 312 respectively abutting against the two bottom limiting surfaces 142 and two latching elastic arms 313 extending from both sides of the body portion 311 and having ends thereof to respectively abut against the two top limiting surfaces 141, so that the mounting section 31 is limited in position by both the two top limiting surfaces 141 and the two bottom limiting surfaces 142 in the mating direction D1. In the first embodiment, each latching elastic arm 313 has a transverse portion 313a connecting the body portion 311, a straight extending portion 313b bending from the transverse portion 313a and extending toward a direction away from the mounting surface 11 in the mating direction D1 and an oblique extending portion 313c extending from the straight extending portion 313b toward a direction away from the mounting surface 11 and gradually away from the body portion 311, an end of the oblique extending portion 313c is used to abut against the top limiting surface 141. And the transverse portions 313a of the two latching elastic arms 313 respectively form the two abutting shoulders 312 on sides of the transverse portions 313a of the two latching elastic arms 313 toward the mounting surface 11 to abut against the corresponding bottom limiting surfaces 142. The board fastener 3 further has a plurality of interference protruding-blocks 34 protruding from both sides of the intermediate section 32 in the width direction D2, so as to provide interference and retention with an inner wall of the penetrating-groove shaped bottom accommodating portion 132. When the board fastener 3 is mounted on the insulative housing 1, as shown in FIG. 8, the board fastener 3 is placed in the mounting chamber 13 from up to down, and the two latching elastic arms 313 are guided through the guiding grooves 145 and the guiding surfaces 144 to enter the top accommodating portion 131. Specifically, as shown in FIG. 11, a minimum distance L1 between the two limiting blocks 143 respectively on the two side walls 14 is less than a maximum distance L2 between the ends of the two latching elastic arms 313. When the two latching elastic arms 313 respectively passing through the guiding surfaces 144 of the limiting blocks 143 along the corresponding guiding grooves 145, the ends of the two latching elastic arms 313 are squeezed and elastically displace toward each other to shorten a distance between the ends of the two latching elastic arms 313 in the width direction D2, after the ends of the two latching elastic arms 313 respectively pass through the guiding surfaces 144, because the squeezing is released and the ends of the two latching elastic arms 313 recover, the ends of the two latching elastic arms 313 enter a space of the top accommodating portion 131 and are positioned below the corresponding top limiting surfaces 141, and meanwhile bottom sides (that is the abutting shoulders 312) of the transverse portions 313a of the two latching elastic arms 313 abut against the respective bottom limiting surfaces 142, thus the board fastener 3 is limited in position in the mating direction D1. The non-destructive limit abutment structure between the latching elastic arm 313 integrally formed on both sides of the mounting section 31 of the board fastener 3 and the insulative housing 1 enables the board fastener 3 to be assembled more robustly and firmly on the insulative housing 1, particularly is capable of withstanding mechanical shock and vibration. Moreover, a limiting structure formed directly by the latching elastic arm 313 which can be limited in position by the insulative housing 1 in the mating direction D1 enables the dimension of the board fastener 3 to be effectively compact. Additionally, interference between the interference protruding-blocks 34 and the insulative housing 1 can increase the retention force of the board fastener 3 to the insulative housing 1. Also, in the first embodiment, the tail section 33 extends in a plate shape as whole from the intermediate section 32 to be adapted to be soldered to the circuit board 4. As shown in FIG. 11, the tail section 33 of the board fastener 3 is inserted into the through hole 41 of the circuit board 4, and the tail section 33 is engaged with and fixed to the circuit board 4 by soldering, and a downward pulling force applied to the tail section 33 by a solidified solder would be generated after soldering, such a pulling force may increase the retention force of the board fastener 3 applied to the insulative housing 1 by that the abutting shoulders 312 of the board fastener 3 abut against the bottom limiting surfaces 142 of the insulative housing 1, so that the insulative housing 1 can be more firmly fixed to the circuit board 4.

Figure 12:
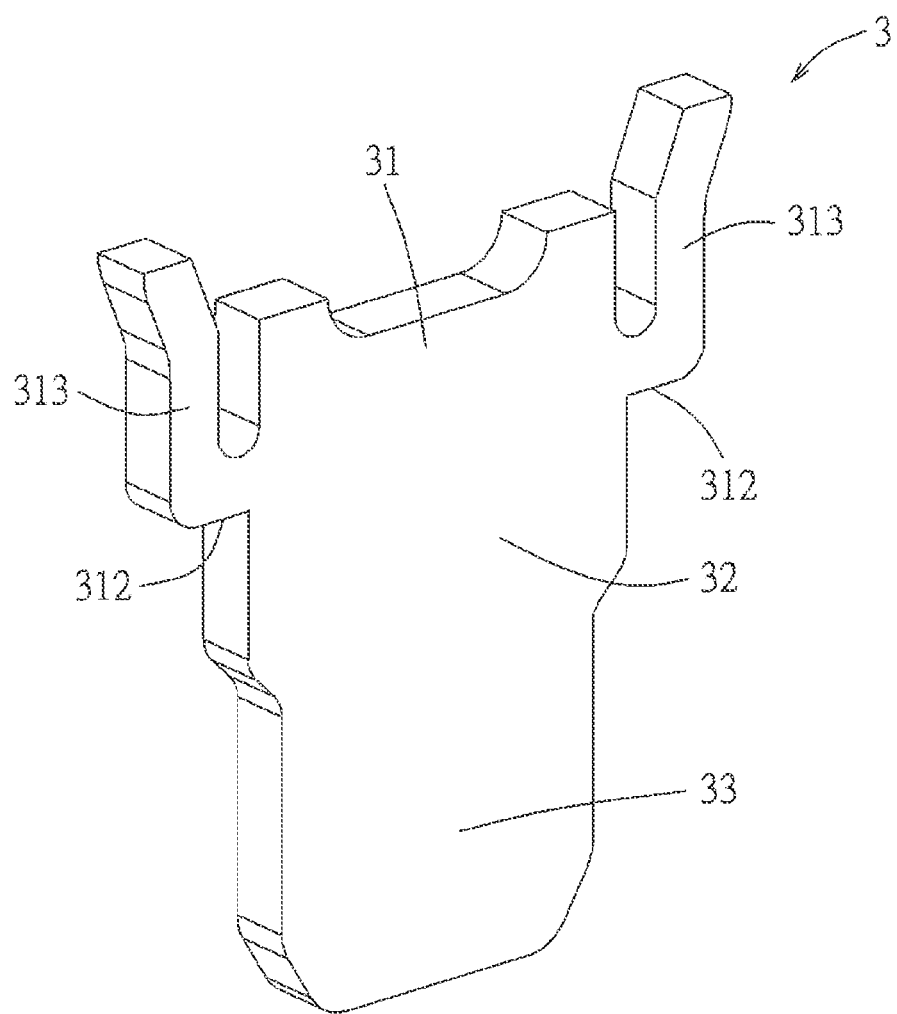
FIG. 12 is a perspective view of a board fastener of a second embodiment of the electrical connector of the present disclosure.
Figure 13:
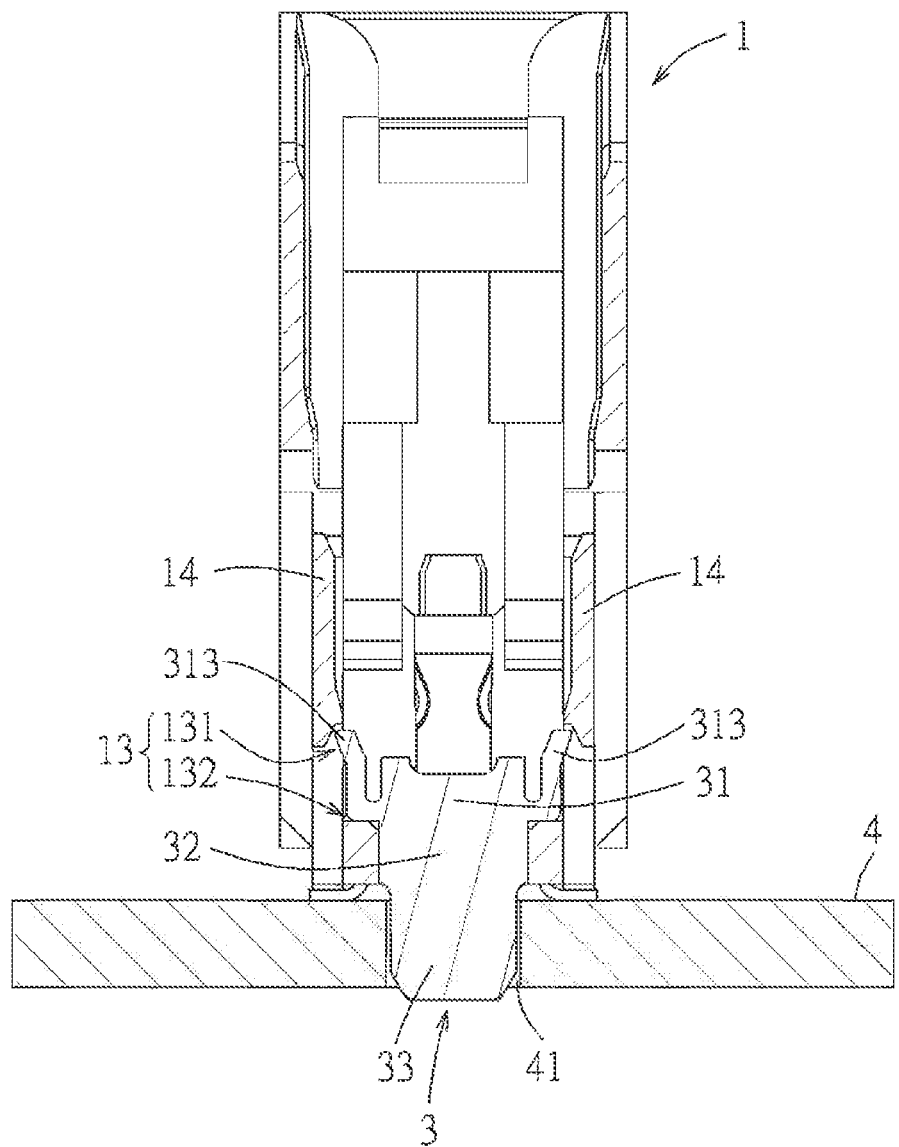
FIG. 13 is a cross-sectional view of an assembled state of the second embodiment and a circuit board, in which a latching member is not shown.

Referring to FIG. 12 and FIG. 13, a second embodiment of the electrical connector of the present disclosure differs from the first embodiment in that: the board fastener 3 can be implemented without the interference protruding-block 34.

Figure 14:
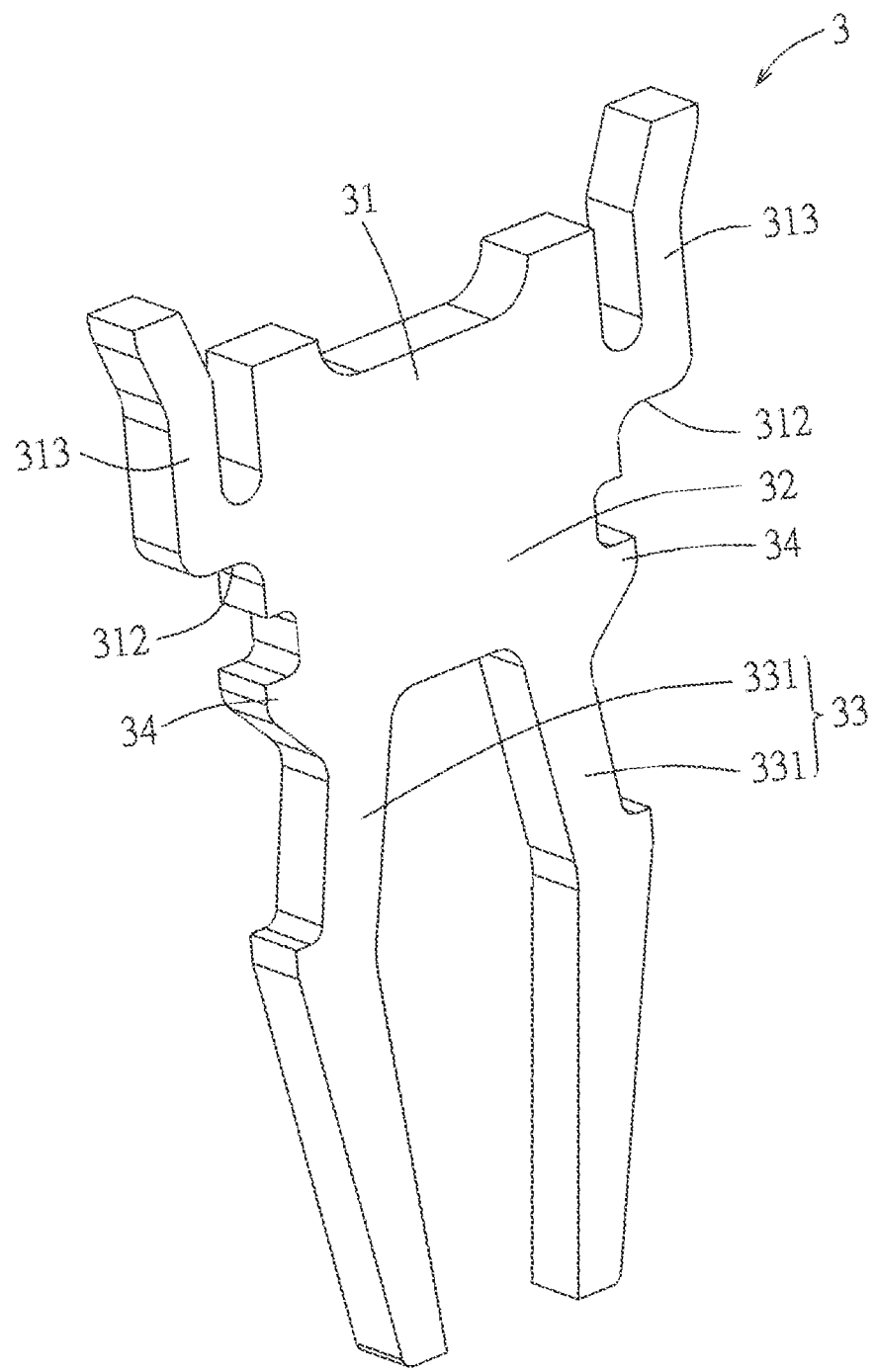
FIG. 14 is a perspective view of a board fastener of a third embodiment of the electrical connector of the present disclosure.
Figure 15:
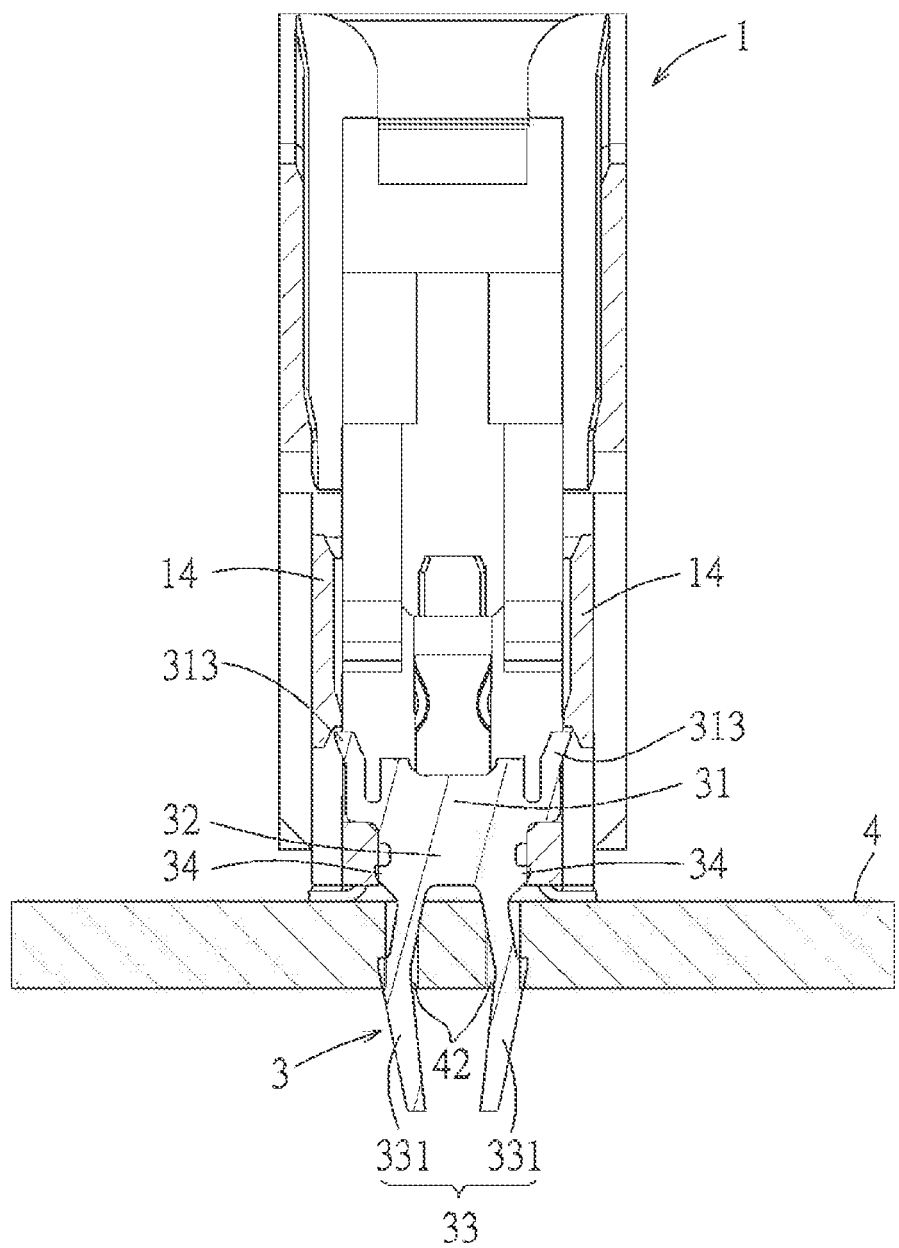
FIG. 15 is a cross-sectional view of an assembled state of the third embodiment and a circuit board, in which a latching member is not shown.

Referring to FIG. 14 and FIG. 15, a third embodiment of the electrical connector of the present disclosure differs from the first embodiment: the tail section 33 of the board fastener 3 bifurcates from the intermediate section 32 to be two insert legs 331 for inserting and fixing into the corresponding inserting holes 42 of the circuit board 4.

Figure 16:
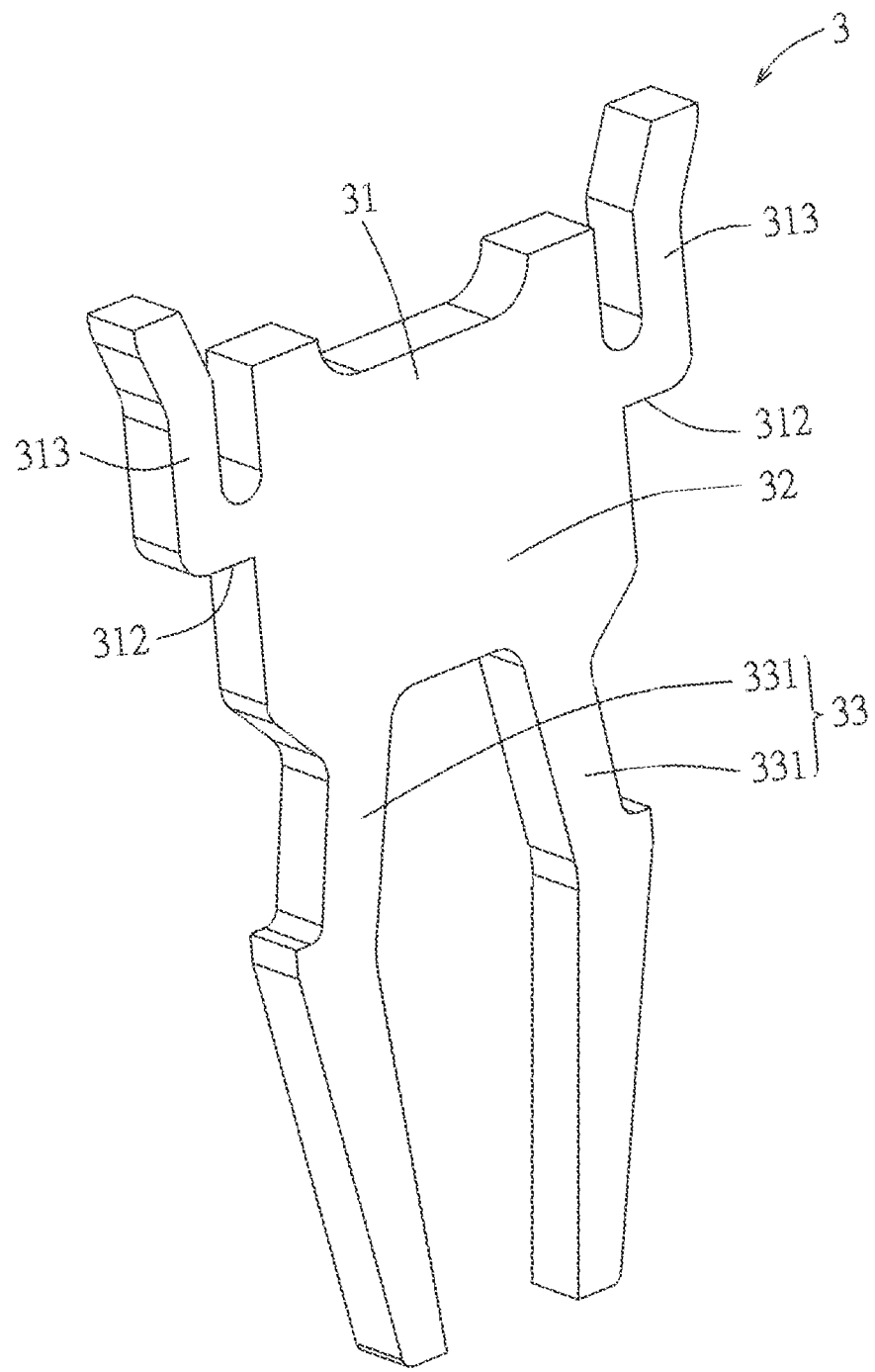
FIG. 16 is a perspective view of a board fastener of a fourth embodiment of the electrical connector of the present disclosure.
Figure 17:
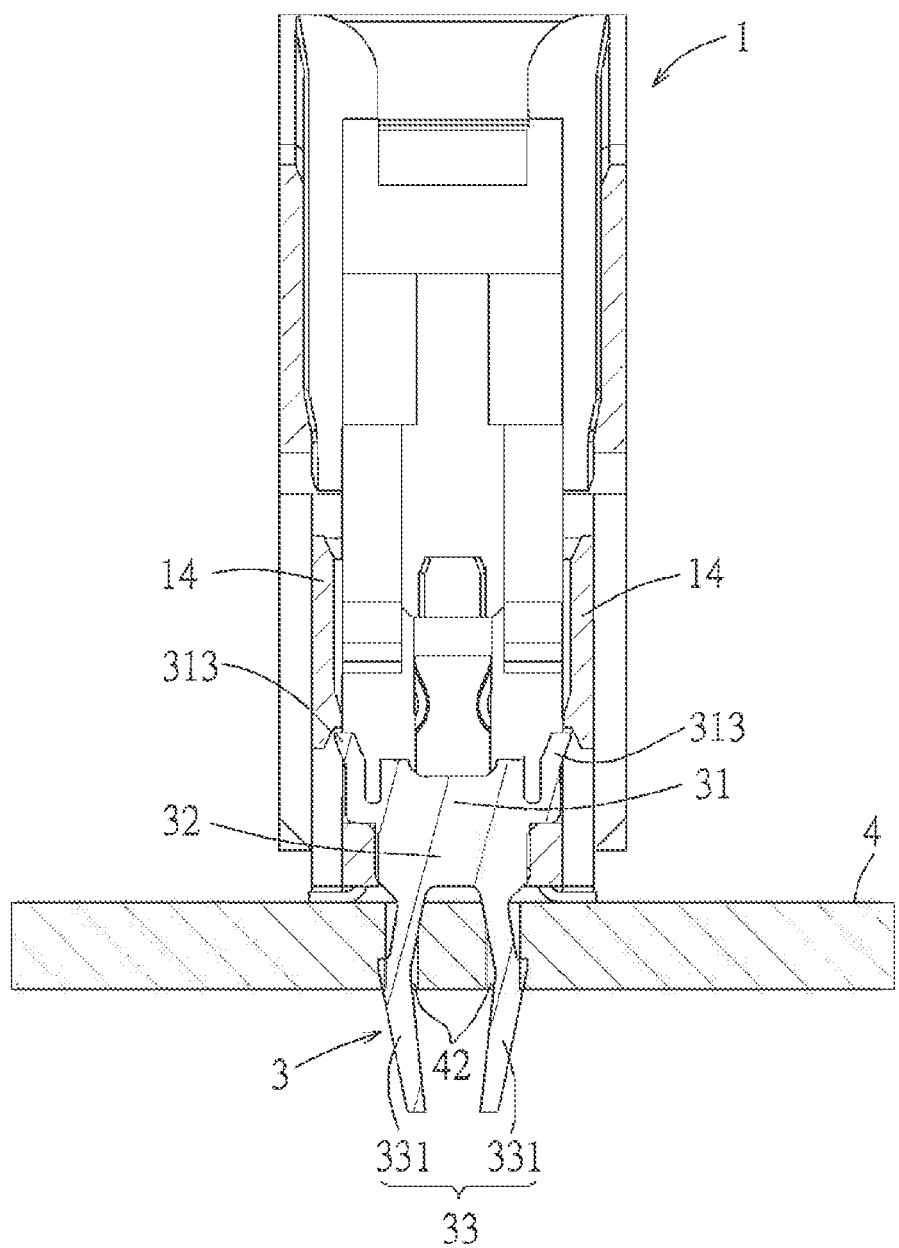
FIG. 17 is a cross-sectional view of an assembled state of the fourth embodiment and a circuit board, in which a latching member is not shown.

Referring to FIG. 16 and FIG. 17, a fourth embodiment of the electrical connector of the present disclosure differs from the third embodiment in that: the board fastener 3 can be implemented without the interference protruding-block 34.

In conclusion, the non-destructive limit abutment structure between the latching elastic arm 313 integrally formed on both sides of the mounting section 31 of the board fastener 3 and the insulative housing 1 enables the board fastener 3 to be assembled more robustly and firmly on the insulative housing 1, particularly is capable of withstanding mechanical shock and vibration. Moreover, a limiting structure formed directly by the latching elastic arm 313 which can be limited in position by the insulative housing 1 in the mating direction D1 enables the dimension of the board fastener 3 to be effectively compact.

However, the above description is only for the embodiments of the present disclosure, the implementation scope of the present disclosure is not limited thereto, simple equivalent changes and modifications made according to the scope of the Claims and the specification of the present disclosure are still included in the scope of the present disclosure.

What is claimed is:

1. An electrical connector, comprising:
   an insulative housing having a mounting surface and a mating surface on opposite sides in a mating direction and at least one mounting chamber, the mounting chamber extending and penetrating the mounting surface in the mating direction, and the mounting chamber having a top accommodating portion and a bottom accommodating portion extending and penetrating the mounting surface from the top accommodating portion in the mating direction, the insulative housing further having two side walls facing each other in a width direction perpendicular to the mating direction, and each corresponding side wall being formed with a top limiting surface and a bottom limiting surface which define the top accommodating portion, the top limiting surface facing the mounting surface, the bottom limiting surface facing the top limiting surface in the mating direction and being closer to the bottom accommodating portion than the top limiting surface;
   a plurality of conductive terminals provided to the insulative housing; and
   at least one board fastener provided to the insulative housing and corresponding to the at least one mounting chamber, the board fastener being plate-shaped and having a mounting section accommodated in the top accommodating portion, an intermediate section extending from the mounting section and accommodated in the bottom accommodating portion and a tail section extending out of the mounting surface of the insulative housing from the intermediate section, the mounting section having a body portion connecting the intermediate section, two abutting shoulders respectively abutting against the two bottom limiting surfaces and two latching elastic arms extending from both sides of the body portion and having ends thereof respectively to abut against the two top limiting surfaces, so that the mounting section being limited in position by the two bottom limiting surfaces and the two top limiting surfaces in the mating direction, wherein each latching elastic arm has a transverse portion connecting the body portion, and the transverse portions of the two latching elastic arms respectively form the two abutting shoulders on sides of the transverse portions of the two latching elastic arms toward the mounting surface.

2. The electrical connector of claim 1, wherein a width of the top accommodating portion in the width direction is greater than a width of the bottom accommodating portion, and the bottom limiting surfaces are formed at a boundary between the top accommodating portion and the bottom accommodating portion, and the two side walls each are provided with a limiting block forming the top limiting surface, a minimum distance between the two limiting blocks respectively on the two side walls is less than a maximum distance between the two latching elastic arms.

3. The electrical connector of claim 2, wherein each limiting block fluffier forms a guiding surface opposite to the top limiting surface in the mating direction, the guiding surfaces of the two limiting blocks obliquely extend toward each other and obliquely to the mounting surface, the two side walls each form a guiding groove extending in the mating direction and adjacent to the corresponding guiding surface, so that the two latching elastic arms are guided through the guiding grooves and the guiding surfaces to enter the top accommodating portion when the board fastener is mounted.

4. The electrical connector of claim 3, wherein each latching elastic arm further has a straight extending portion bending from the transverse portion and extending toward a direction away from the mounting surface in the mating direction, and an oblique extending portion extending from the straight extending portion toward a direction away from the mounting surface and gradually away from the body portion.

5. The electrical connector of claim 1, wherein the board fastener further has a plurality of interference protruding-blocks protruding from both sides of the intermediate section in the width direction, so as to interfere with the bottom accommodating portion.

6. The electrical connector of claim 1, wherein the tail section extends in a plate shape as whole from the intermediate section to be adapted to be soldered.

7. The electrical connector of claim 1, wherein the tail section bifurcates from the intermediate section to be two insert legs.

8. The electrical connector of claim 2, wherein the insulative housing further has two recessed portions respectively extending from the two top limiting surfaces toward the mounting surface in the mating direction and penetrating the two side walls in the width direction.

* * * * *